(12) United States Patent
Hamazaki

(10) Patent No.: US 7,444,611 B2
(45) Date of Patent: Oct. 28, 2008

(54) AUTOMATIC DESIGN METHOD INCLUDING AUTOMATIC PROCESSING FOR EQUALIZING SPACING WIRING AND AUTOMATIC DESIGNING APPARATUS THEREOF

(75) Inventor: Ryoji Hamazaki, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 239 days.

(21) Appl. No.: 11/444,528

(22) Filed: Jun. 1, 2006

(65) Prior Publication Data

US 2006/0277505 A1    Dec. 7, 2006

(30) Foreign Application Priority Data

Jun. 2, 2005     (JP) .............................. 2005-162530

(51) Int. Cl.
*G06F 17/50* (2006.01)

(52) U.S. Cl. .......................................... 716/14; 716/15
(58) Field of Classification Search ............. 716/10–15, 716/4
See application file for complete search history.

(56) References Cited

U.S. PATENT DOCUMENTS 6,202,195 B1 * 3/2001 Tanaka et al. ................. 716/13
7,013,253 B1 * 3/2006 Cong et al. .................... 703/14
2006/0117290 A1 * 6/2006 Katagiri ........................ 716/13

FOREIGN PATENT DOCUMENTS

| JP | 5-250441 | 9/1993 |
|----|----------|--------|
| JP | 7-271836 | 10/1995 |
| JP | 2000-35986 | 2/2000 |
| JP | 2000-100955 | 4/2000 |
| JP | 2002-83006 | 3/2002 |

* cited by examiner

*Primary Examiner*—Stacy A Whitmore
(74) *Attorney, Agent, or Firm*—Studebaker & Brackett PC; Donald R. Studebaker

(57) ABSTRACT

In an area extracting step, areas interposed among tower post rows adjacent to one another, and rectangular areas interposed among the tower post rows and pads at outer peripheral portions of a chip are respectively extracted as areas in which equalization of wire spacings is performed. Areas interposed among tower post columns adjacent to one another, and rectangular areas interposed among the tower post columns and pads at outer peripheral portions of the chip are also respectively extracted as areas in which equalization of wire spacings is performed. A wiring extracting step for extracting wirings from an equalized area, a wire spacing equalizing step for extracting line segments extending in a longitudinal direction of the equalized area from the extracted wirings and shifting the same to thereby equalize spacing these line segments, and an expanding/contracting step for extracting and expanding/contracting line segments other than those extending in a longitudinal direction to thereby restore the states of connections of the line segments to the longitudinally-extending line segments.

12 Claims, 13 Drawing Sheets

FIG. 7
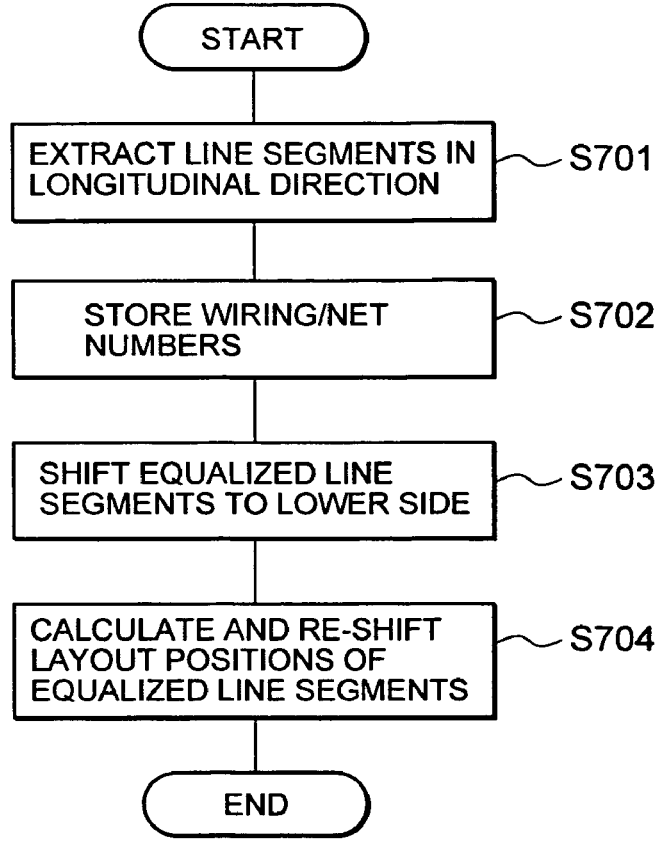
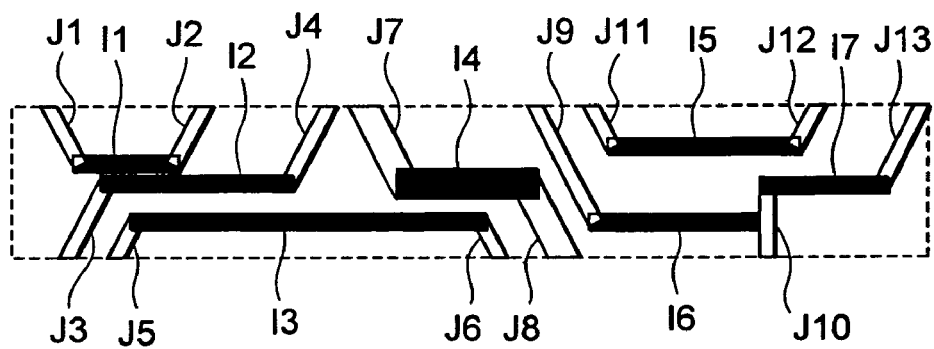
FIG. 8A
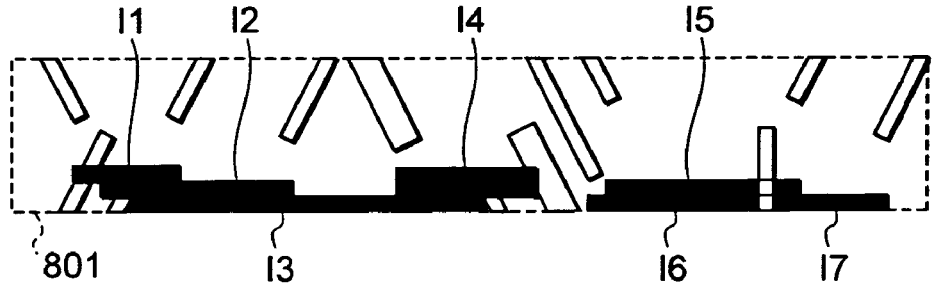
FIG. 8B

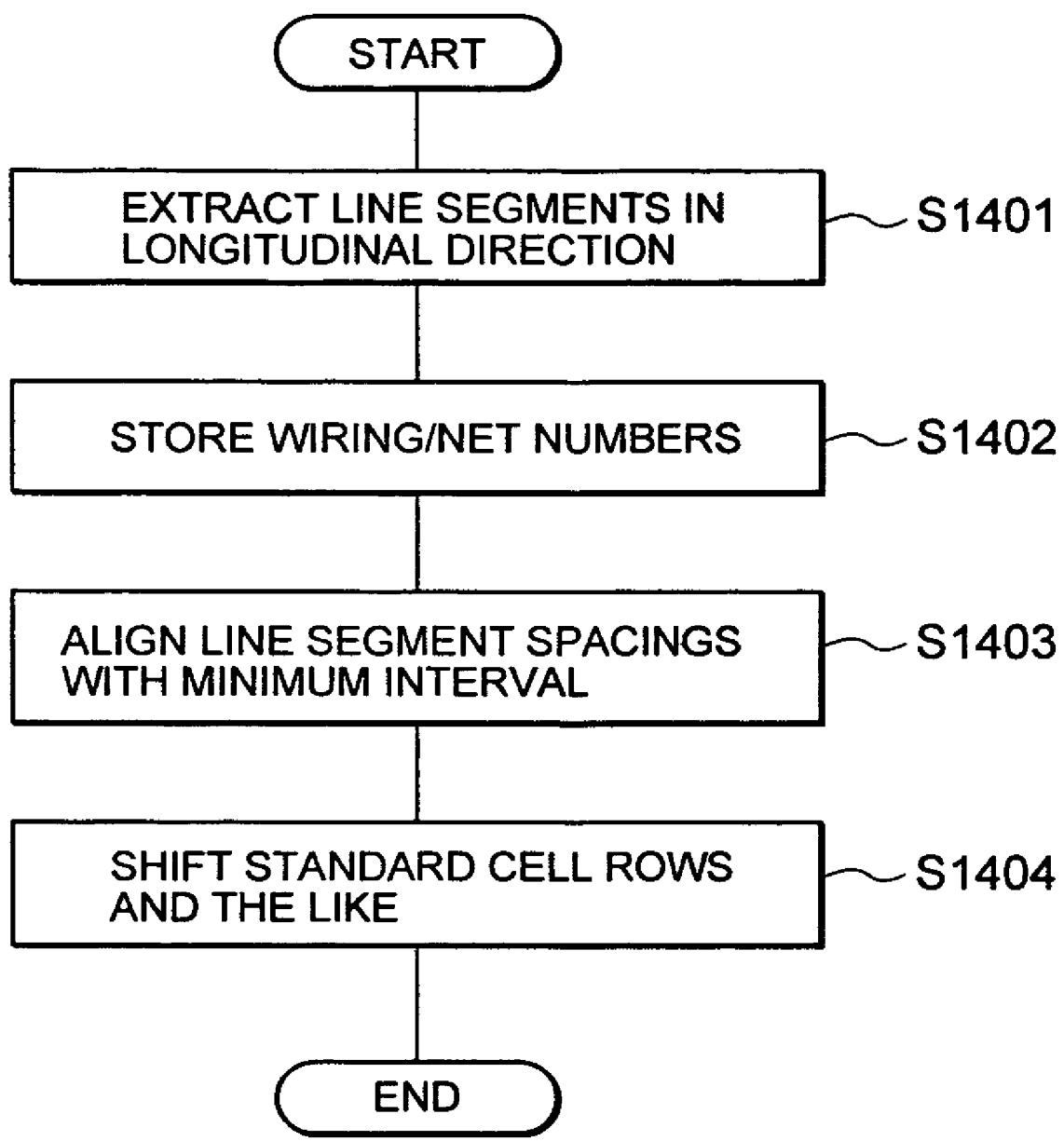

AUTOMATIC DESIGN METHOD INCLUDING AUTOMATIC PROCESSING FOR EQUALIZING SPACING WIRING AND AUTOMATIC DESIGNING APPARATUS THEREOF

BACKGROUND OF THE INVENTION

The present invention relates to a technique which automatically designs a semiconductor integrated circuit, and more specifically to a technique which automatically performs processing for equalizing spacing wirings formed in a semiconductor integrated circuit.

With high integration/multifunctioning and the like of a semiconductor integrated circuit, the number of pads in such a semiconductor integrated circuit and the number of external connecting electrodes (i.e., electrode pins) of a semiconductor package have been on the increase in recent years. Therefore, design work for wiring the electrode pins and the pads also has increased in complexity. There has been an increasingly demand for an automated technique for such design work.

As techniques for automating wirings among pads and electrode pins, there have heretofore been known ones disclosed in, for example, the following patent documents 1 through 5 (Japanese Unexamined Patent Publication No. 2000-35986, Japanese Unexamined Patent Publication No. 2000-100955, Japanese Unexamined Patent Publication No. Hei 5(1993)-250441, Japanese Unexamined Patent Publication No. Hei 7(1995)-271836, and Japanese Unexamined Patent Publication No. 2002-83006).

In the patent document 1, the placement area of electrode pins is divided into four trapezoidal areas, and the electrode pins for their divided areas and pads arranged along outline side opposite to the divided areas are wired in accordance with predetermined priorities (refer to paragraphs 0111 through 0120, FIGS. 6 through 9, FIG. 12, etc. in the patent document 1).

In the patent document 2, common pullout patterns for wiring a plurality of pads and a plurality of electrode pins are formed in advance and disposed appropriately, thereby realizing an automatic placement (refer to paragraphs 0039 and 0040 and the like in the patent document 2).

In the patent document 3, on-grid type wire-connection processing and off-grid type wire-connection processing are combined together to attain the shortening of a wire-connection processing time while the occurrence of a unconnected pin pair is being prevented (refer to paragraph 0013 and the like in the patent document 3).

In the patent document 4, a wire spacing arbitrarily determined by a designer is changed to a wire spacing pre-stored in wire spacing memory means to thereby optimize the wire spacing (refer to paragraph 0016 and the like in the patent document 4).

In the patent document 5, a wire spacing arbitrarily determined by a designer is changed to a uniform wire spacing to thereby optimize the wire spacing (refer to paragraphs 0023 and 0024 in the patent document 5).

It is desirable to equalize wire spacings upon design work for the semiconductor integrated circuit. This is because when the wire spacings are not uniform, malfunctions such as deterioration in reliability and moisture resistance due to migration (phenomenon that a metal used as a wiring and an electrode migrates on an insulator), wiring-to-wiring shorts due to a failure in plating, variations in delay time due to variations in parasitic capacitance between wirings, etc. become easy to occur.

In contrast to this, the patent documents 4 and 5 disclose the techniques each of which adjusts the interval between wirings. Thus, the interval between the wirings is made uniform by using these techniques to make it possible to prevent the occurrence of shorts and breaks.

In the technique disclosed in the patent document 4, however, the interval between the wirings is merely changed depending upon the information read from the wire spacing memory means. Therefore, it is satisfactory where wire spacings in a wiring area (refer to, for example, FIG. 10 in the patent document 4) including only vertical and horizontal wirings are adjusted. However, it is difficult to apply the technique to such complex wirings as to contain line segments in an oblique direction.

On the other hand, since the wire spacings are adjusted using arcs or ellipses for correction, the technique of the patent document 5 can be applied to wirings containing line segments extending in an oblique direction. The technique of the patent document 5 is however accompanied by a drawback that computing processing for determining the optimum position of each wiring is complex.

SUMMARY OF THE INVENTION

An object of the present invention is to provide a technique which equalizes wiring spacing complex wirings by simple processing alone.

(1) A first invention relates to an automatic designing method suitable for a semiconductor device, which automatically performs processing for equalizing spacing wirings formed in a semiconductor integrated circuit.

The automatic designing method includes an area extracting step for extracting an equalized area from layout data of the semiconductor integrated circuit, a wiring extracting step for extracting the wirings from the equalized area extracted in the area extracting step, an equalizing step for extracting line segments extending in a longitudinal direction of the equalized area from the wirings extracted in the wiring extracting step and shifting the same to thereby equalize spacing these line segments, and an expanding/contracting step for extracting other line segments from the wirings extracted in the wiring extracting step and expanding/contracting the same to thereby restore the states of connections of other line segments to the longitudinally-extending line segments.

(2) A second invention relates to an automatic designing apparatus suitable for a semiconductor device, which automatically performs processing for equalizing spacing wirings formed in a semiconductor integrated circuit.

The automatic designing apparatus includes area extracting means for extracting an equalized area from layout data of the semiconductor integrated circuit, wiring extracting means for extracting the wirings from the equalized area extracted by the area extracting means, equalizing means for extracting line segments extending in a longitudinal direction of the equalized area from the wirings extracted by the wiring extracting means and shifting the same to thereby equalize spacing these line segments, and expanding/contracting means for extracting other line segments from the wirings extracted by the wiring extracting means and expanding/contracting the same to thereby restore the states of connections of other line segments to the longitudinally-extending line segments.

According to the present invention, line segments extending in a longitudinal direction are extracted from wirings to be equalized and spacing the line segments are equalized. Thereafter, other line segments are expanded and contracted to restore their connected states. It is therefore possible to equalize wiring spacing complex wirings by simple processing alone.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 7 is a flowchart showing a wire space equalizing step shown in FIG. 2;

FIG. 8 is a conceptual diagram depicting layout data in the wire space equalizing step shown in FIG. 2;

FIG. 14 is a flowchart showing a wire space equalizing step according to a third embodiment.

DETAILED DESCRIPTION OF THE PREFERRED EMBODIMENTS

Preferred embodiments of the present invention will hereinafter be described with reference to the accompanying drawings. The size, shape and physical relationship of each constituent element in the figures are merely approximate illustrations to enable an understanding of the present invention. Further, the numerical conditions explained below are nothing more than examples.

First Preferred Embodiment

An automatic designing method according to a first embodiment and wiring space automatic equalizing processing according to an automatic designing apparatus will first be explained.

The present embodiment shows an example in which an automatic design technique of the present invention is applied to wiring space equalization between pads and tower posts in a W-CSP (Wafer Level Chip Size Package).

Figure 1:
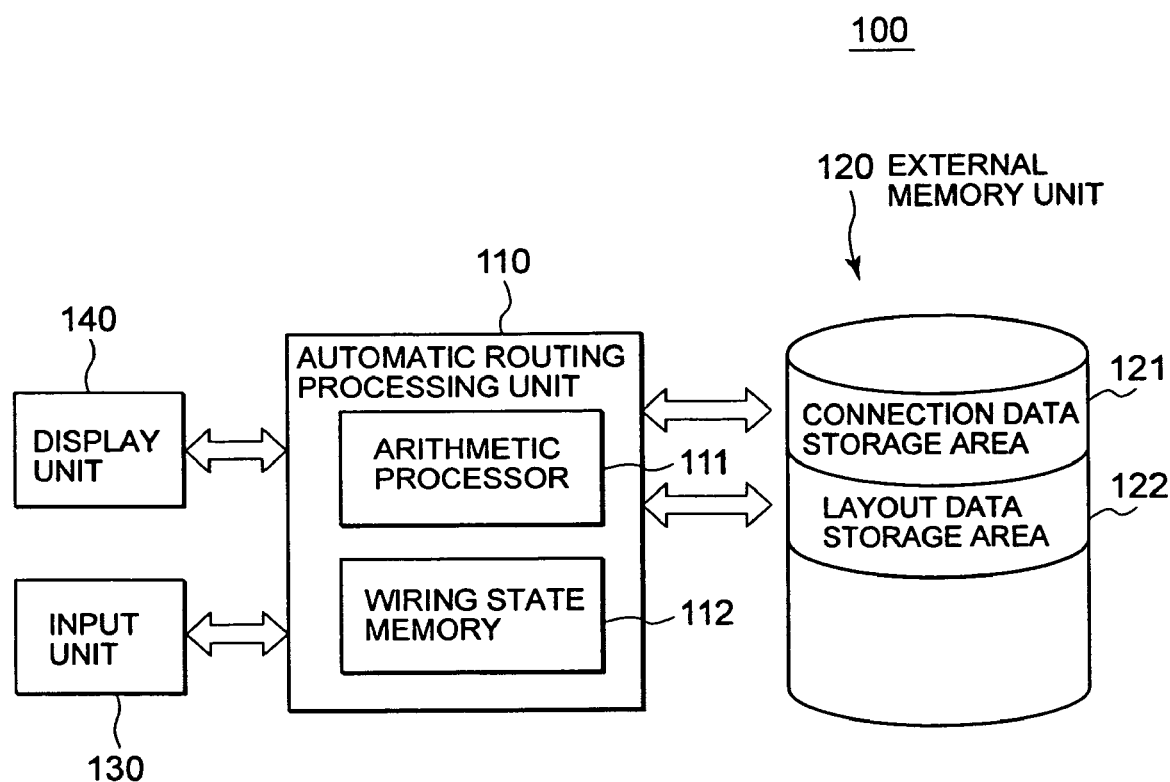
FIG. 1 is a block diagram schematically showing an overall configuration of an automatic designing apparatus according to each of first through third embodiments.

FIG. 1 is a block diagram schematically showing an overall configuration of an automatic designing apparatus according to the present embodiment. As shown in FIG. 1, the automatic designing apparatus 100 according to the present embodiment includes an automatic routing processing unit 110, an external memory unit 120, an input unit 130, and a display unit 140.

The automatic routing processing unit 110 automatically performs equalization of wire spacings. To this end, the automatic routing processing unit 110 is provided with an arithmetic processor 111 and a wiring state memory 112. The arithmetic processor 111 executes such wiring space automatic equalizing processing to be described later. The wiring state memory 112 appropriately stores data indicative of a wiring state in the process of the arithmetic processor 111.

The external memory unit 120 comprises, for example, a hard disk or the like and has a connection data storage area 121 and a layout data storage area 122. Data such as net numbers (logical connection information about wiring), etc. are stored in the connection data storage area 121. Layout data generated by allowing the arithmetic processor 111 to complete the wiring space automatic equalizing processing is read from the wiring state memory 112 and stored in the layout data storage area 122.

The input unit 130 comprises a keyboard, a computer mouse and the like. A designer makes use of it upon, for example, the input of constraints and conditions or the like on the wiring space automatic equalizing processing.

The display unit 140 comprises, for example, a CRT (Cathode Ray Tube) or a liquid crystal or the like. The designer uses it to confirm the result of an input by the input unit 130, the result (i.e., the final layout data of the wiring state memory 112) of the wiring space automatic equalizing processing, etc.

Figure 2:
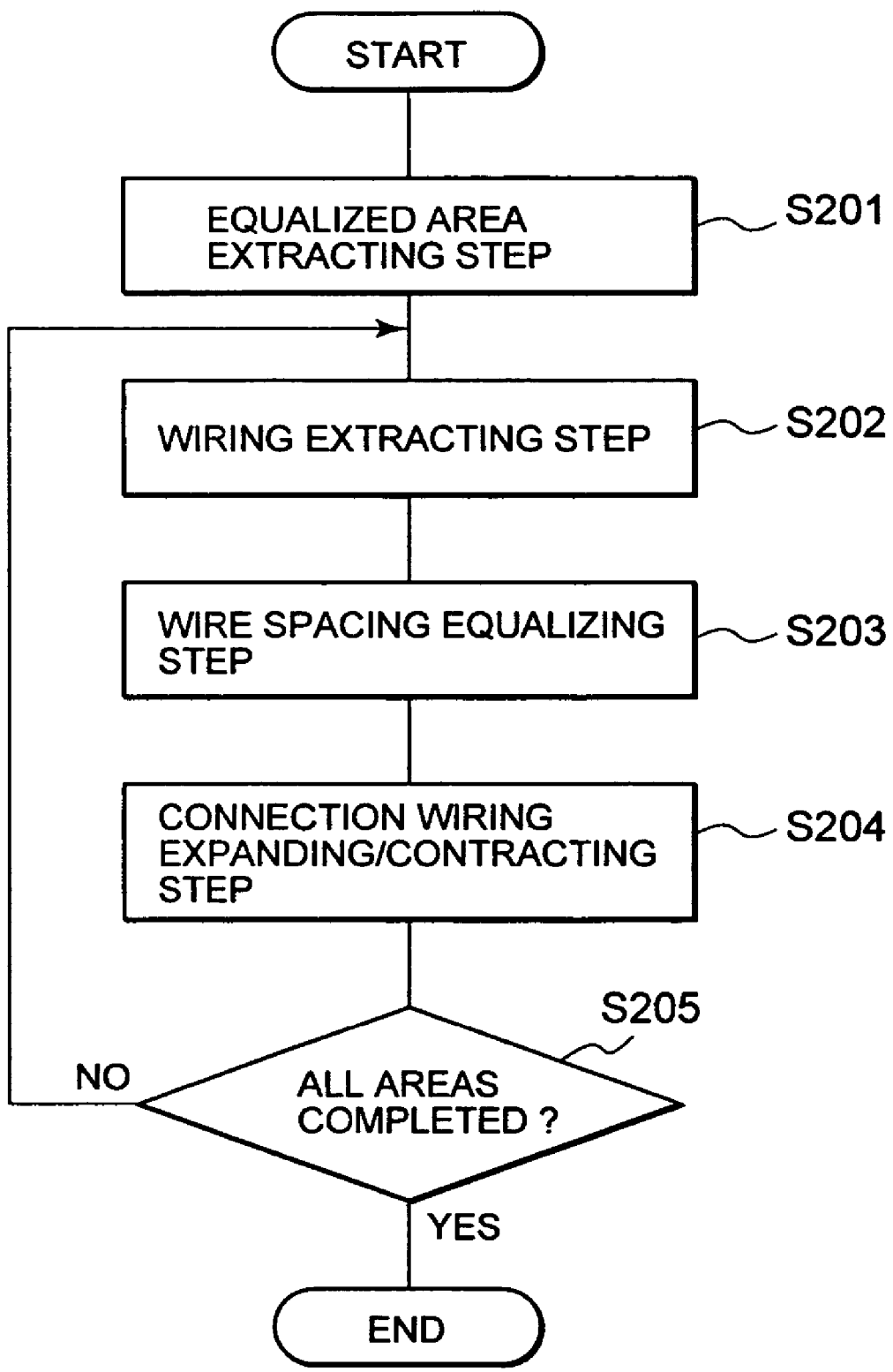
FIG. 2 is a schematic flowchart showing an overall constitution of an automatic designing method according to the first embodiment.

FIG. 2 is a schematic flowchart showing an overall constitution of the wiring space automatic equalizing processing according to the present embodiment.

Upon automatic design according to the present embodiment as shown in FIG. 2, an equalized area extracting step (refer to Step S201) is first executed. Thereafter, a wiring extracting step (refer to Step S202), a wire space equalizing step (refer to Step S203), and a connection wiring expanding/contracting step (refer to Step S204) are executed every equalized areas. The processes steps corresponding to Steps S202 through 204 are repeated until processing on all equalized areas 431 through 436 and 441 through 446 (refer to FIG. 4) is completed in Step S205.

Details of the Steps S201 through S204 will be explained below.

Equalized Area Extracting Step

Figure 3:
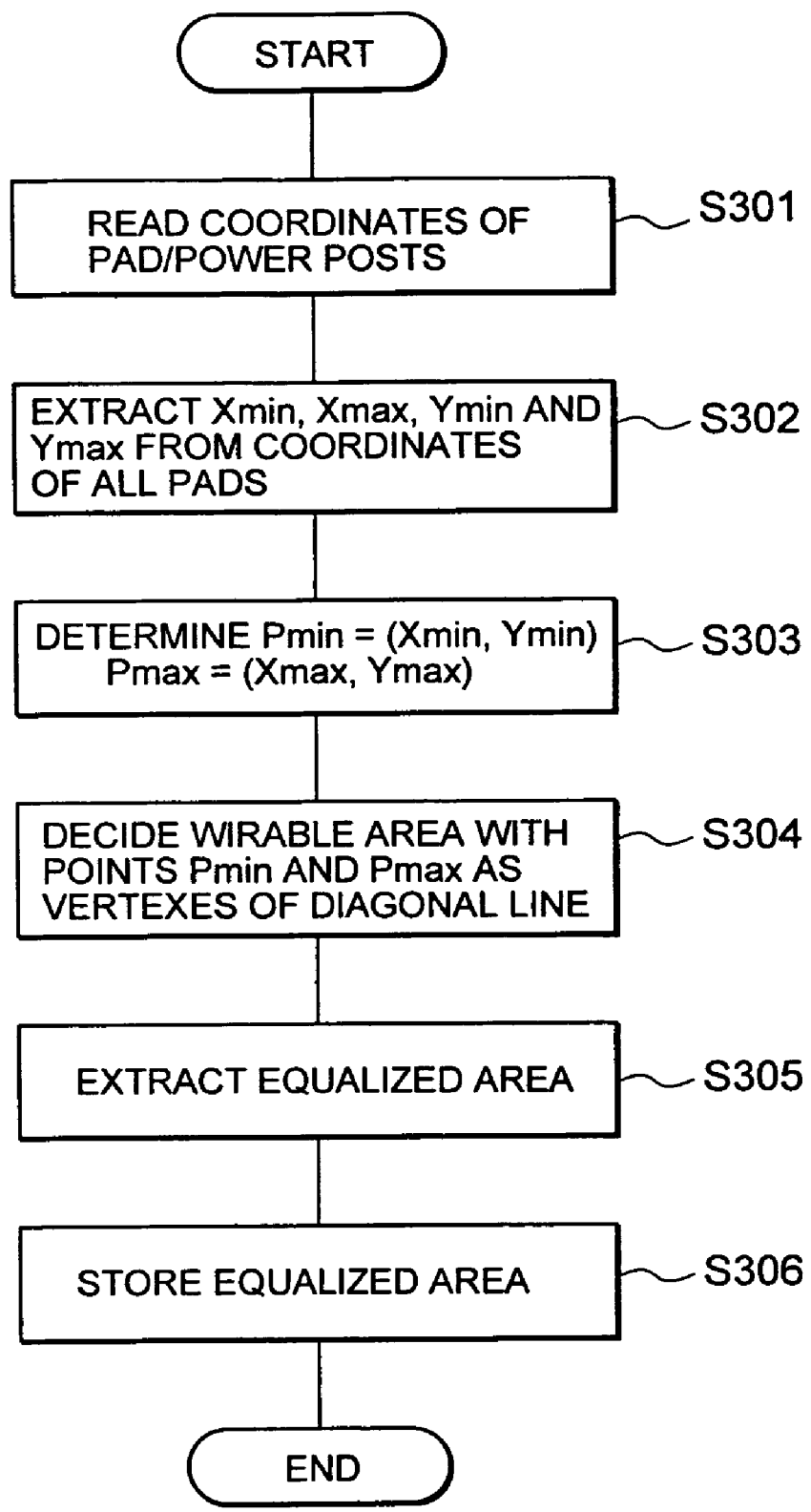
FIG. 3 is a flowchart illustrating an equalized area extracting step shown in FIG. 2.
Figure 4:
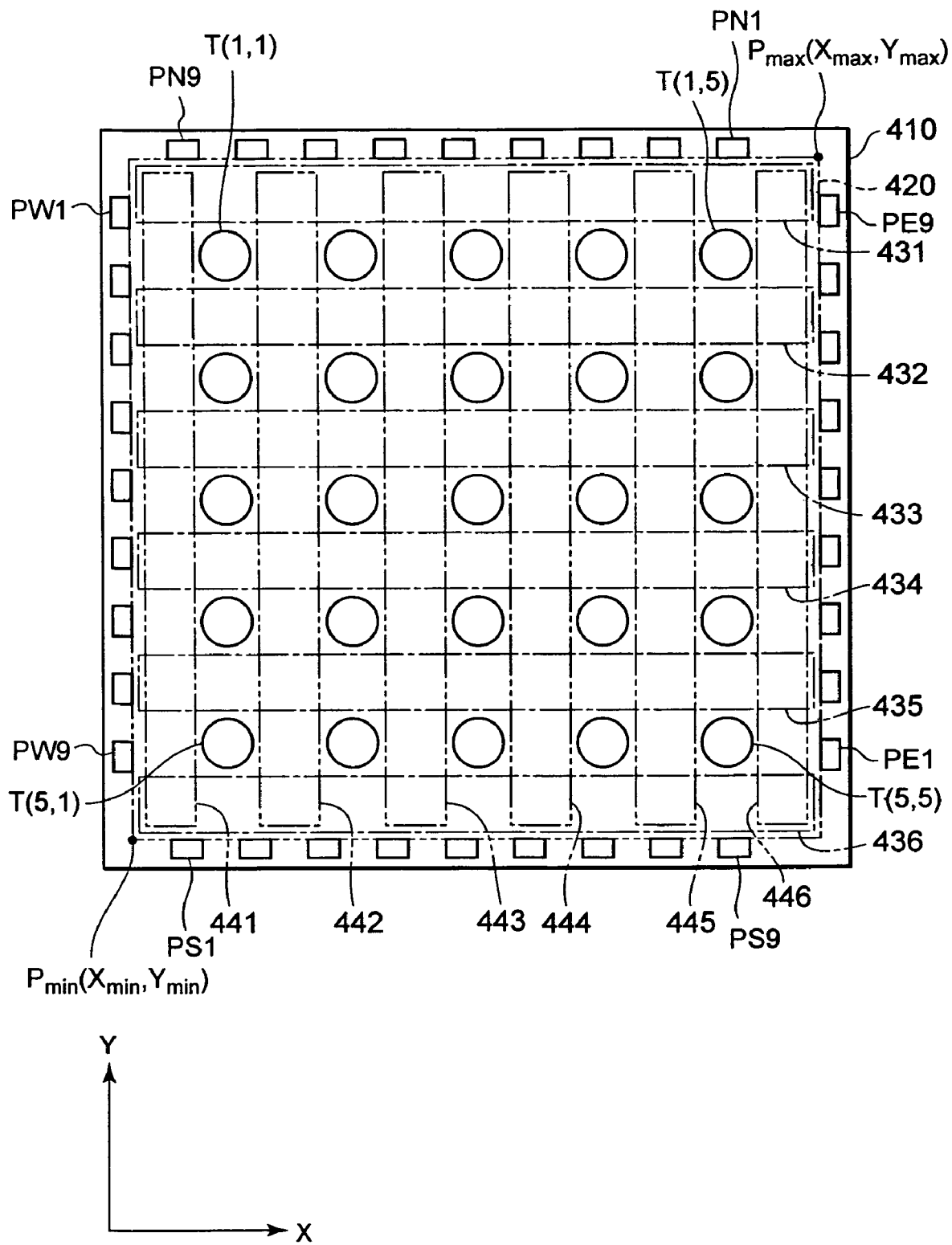
FIG. 4 is a conceptual diagram depicting layout data in the equalized area extracting step shown in FIG. 2.

The equalized area extracting step S201 will be described using FIGS. 3 and 4. Now, FIG. 3 is a detailed flowchart showing the present step S201, and FIG. 4 is a conceptual diagram showing layout data in the present step S201. As shown in FIG. 4, the layout data contain pads PW1 through PW9, PS1 through PS9, PE1 through PE9 and PN1 through PN9 disposed nine by nine along respective outer peripheral sides of a semiconductor chip surface 410, and tower posts T(1, 1) through T(5, 5) of 5 rows and 5 columns, which are disposed in the central portion of the semiconductor chip surface 410. Incidentally, although the case in which the tower posts are arranged in 5 rows and 5 columns is explained by way of example, it is needless to say that the number of rows of the tower posts and the number of columns thereof are not limited to the above. If ones connected to the pads through redistribution wirings, other than the tower posts are adopted, then the automatic designing method and apparatus according to the present embodiment can be applied thereto.

As will be described below, equalized areas are extracted from layout data of a semiconductor integrated circuit in the equalized area extracting step S201.

The arithmetic processor 111 first reads the coordinates of the pads PW1 through PN9 and the tower posts T(1, 1) through T(5, 5) from the connection data storage area 121 (see FIG. 1) (refer to Step S301).

Next, the arithmetic processor 111 extracts the minimum values Xmin and Ymin of the X and Y coordinates and the maximum values Xmax and Ymax thereof from data about the coordinates of the pads PW1 through PN9 (refer to Step S302).

Subsequently, the arithmetic processor 111 determines points Pmin=(Xmin, Ymin) and Pmax=(Xmax, Ymax) from these coordinates (refer to Step S303).

The arithmetic processor 111 determines a rectangular area 420 with these two points Pmin and Pmax as vertexes of a diagonal line (refer to Step S304). This area is called "wirable area" below.

Further, the arithmetic processor 111 extracts the areas 432, 433, 434 and 435 among adjacent tower post rows, the area 431 between the leading row of the tower posts T(1, 1) through T(1, 5) and a pad row of the pads PN1 through PN9, and the area 436 between the final row of the tower posts T(5, 1) through T(5, 5) and a pad row of the pads PS1 through PS9 from the wirable area 420. Similarly, the arithmetic processor 111 extracts the areas 442, 443, 444 and 445 among adjacent tower post columns, the area 441 between the leading column of the tower posts T(1, 1) through T(5, 1) and a pad column of the pads PW1 through PW9, and the area 446 between the final column of the tower posts T(1, 5) through T(5, 5) and a pad column of the pads PE1 through PE9 from the wirable area 420 (refer to Step S305).

The arithmetic processor 111 causes the wiring state memory 112 to store these areas 431 through 436 and 441 through 446 as equalized areas (refer to Step S306).

The equalizing area extracting step is thus ended.

Wiring Extracting Step

Figure 5:
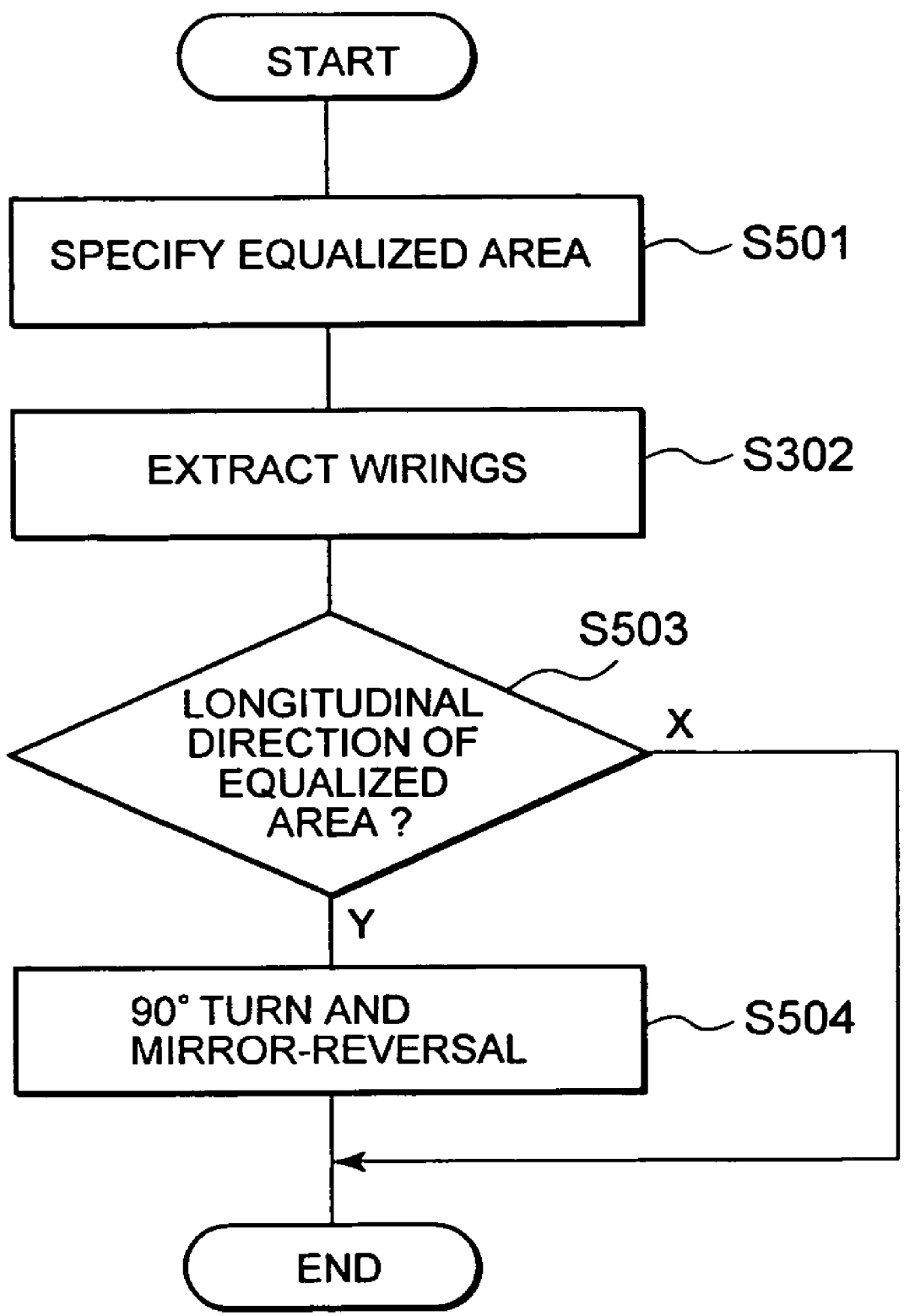
FIG. 5 is a flowchart showing a wiring extracting step shown in FIG. 2.
Figure 6:
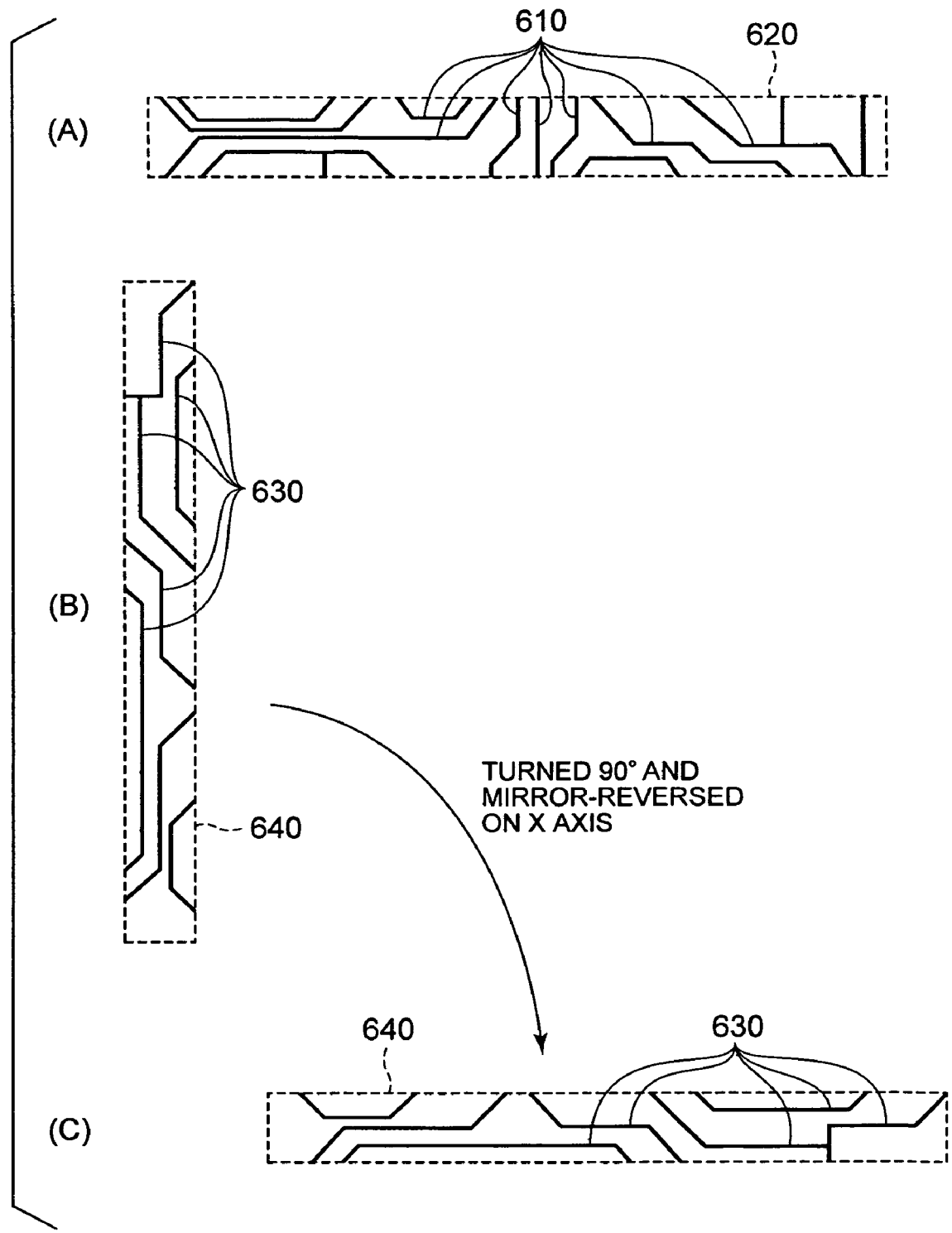
FIG. 6 is a conceptual diagram illustrating layout data in the wiring extracting step shown in FIG. 2.

The wiring extracting step S202 will be explained using FIGS. 5 and 6. Now, FIG. 5 is a detailed flowchart showing the present step S202, and FIG. 6 is a conceptual diagram illustrating layout data in the present step S202, respectively.

In the wiring extracting step S202, as will be described below, wirings are extracted from the equalized areas 431 through 436 and 441 through 446 (refer to FIG. 4) extracted in the equalized area extracting step S201.

The arithmetic processor 111 first specifies one equalized area to be processed from the equalized areas 431 through 436 and 441 through 446 (refer to Step S501).

Next, the arithmetic processor 111 extracts wirings contained in the specified equalized area (refer to Step S502). FIG. 6(A) conceptually shows one example illustrative of wirings included in the equalized areas 431 through 436 (i.e., equalized areas whose longitudinal directions coincide with the direction of an X axis). FIG. 6(B) conceptually shows one example illustrative of wirings contained in the equalized areas 441 through 446 (i.e., equalized areas whose longitudinal directions coincide with the direction of a Y axis). As shown in FIGS. 6(A) and 6(B), the wirings 610 and 630 formed in the surface 410 of the semiconductor chip are cut along outer edges of equalized areas 620 and 640, followed by being extracted.

Subsequently, the arithmetic processor 111 checks whether the equalized area to be processed is either an equalized area long in the X-axis direction or an equalized area long in the Y-axis direction (refer to Step S503).

Then, when the equalized area to be processed is found to be the equalized area long in the Y-axis direction, the arithmetic processor 111 turns the extracted wirings by 90° and mirror-reverses the same on the X axis (refer to Step S504). FIG. 6(C) shows the equalized area subsequent to being subjected to the rotation of 90° and the mirror reversal. By carrying out such conversion processing, the equalized area long in the Y-axis direction can be treated as the equalized area long in the X-axis direction in the following processing step. Thus, since the processing on these equalized areas can be unified, a processing program becomes simple. Incidentally, the equalized area long in the X-axis direction may of course be subjected to the conversion processing without effecting the conversion processing on the equalized area long in the Y-axis direction.

The above processing is effected on all the equalized areas.

Wire Space Equalizing Step

The wire space equalizing step S203 will be explained using FIGS. 7 through 9. Now, FIG. 7 is a detailed flowchart showing the present step S203, and FIGS. 8 and 9 are respectively conceptual diagrams showing layout data in the present step S203.

In the wire space equalizing step S203 as will be described below, longitudinal line segments in the equalized area for the wirings extracted in the wiring extracting step S202 are extracted from the wirings and shifted, whereby the spacing of these line segments are equalized.

First, the arithmetic processor 111 extracts line segments intended for equalization from the wirings extracted in the wiring extracting step S202 (refer to Step S701). Line segments intended for equalization are indicated by diagonal lines in FIG. 8(A). Thus, in the present embodiment, the longitudinal line segments I1 through I7 in the equalized area become intended for equalization.

Next, the arithmetic processor 111 allows the wiring state memory 112 (refer to FIG. 1) to store the line segments I1 through I7 intended for equalization, other line segments J1 through J13 connected to these line segments, and net numbers of these line segments I1 through I7 and J1 through J13 (wiring's logical connection information) (refer to Step S702).

Subsequently, the arithmetic processor 111 shifts the line segments I1 through I7 intended for equalization, respectively, to a side extending along the longitudinal direction of the equalized area (refer to Step S703). In the present embodiment as shown in FIG. 8(B), the line segments I1 through I7 are shifted to the lower side 801. With their shifting, the line segments I1 through I7 are sequentially brought into contact with the side 801 (i.e., the line segments I3, I6 and I7 directly contact the side 801, the line segments I2, I4 and I5 make contact with the side 801 through the line segments I3, I6 and I7 interposed thereamong, and the line segment I1 is brought into contact with the side 801 through the line segments I3 and I2 interposed therebetween).

Further, the arithmetic processor 111 calculates the positions to place the line segments I1 through I7 (refer to Step S704). A method for performing this calculation will be explained using FIG. 9.

Figure 9A:
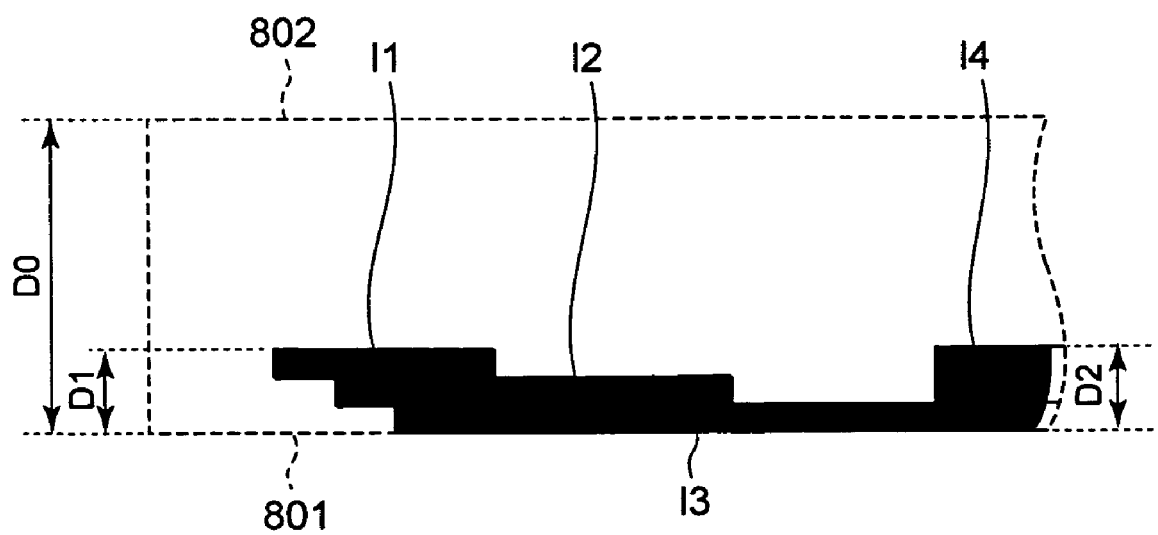
FIG. 9 is a conceptual diagram showing layout data in the wire space equalizing step shown in FIG. 2.
Figure 9B:
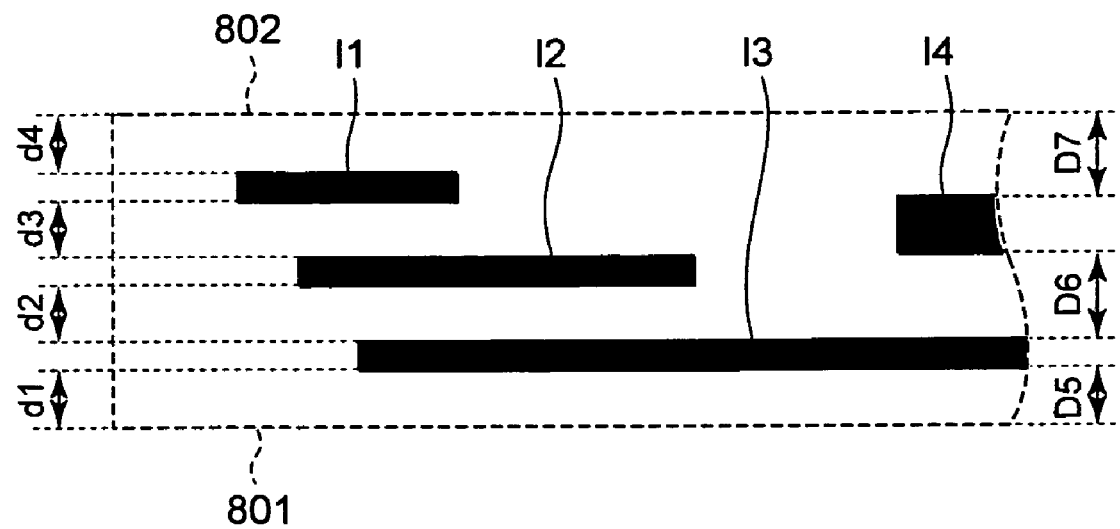

In FIG. 9, FIG. 9(A) is a partly conceptual diagram showing a state in which the above Step S703 is ended, and FIG. 9(B) is a partly conceptual diagram showing a state in which equalizing placement of each line segment is completed.

As shown in FIG. 9(A), the line segments I1 through I3 are shifted so as to contact the side 601 in sequence (see Step S703 referred to above). Therefore, the width D1 of an area where the line segments I1 through I3 are disposed, indicates a total line width of these line segments I1 through I3. The difference between the widths D0 and D1 of the equalized areas corresponds to the width of an area in which no line segments I1 through I3 are disposed.

On the other hand, when the equalizing placement or layout is completed as shown in FIG. 9(B), non-wiring regions or areas are respectively provided between the lower side 801 of the equalized area and its upper side 802. Since wire spacings are equalized in the present embodiment, the widths d1 through d4 among these non-wiring areas become identical to one another.

Here, the non-wiring area width D0−D1 shown in FIG. 9(A) coincides with the sum d1+d2+d3+d4 of the non-wiring area widths shown in FIG. 9(B). Thus, the values of the non-wiring area widths d1 through d4 may respectively be set to (D0−D1)/4 to equally dispose the line segments I1 through I3.

The arithmetic processor 111 re-shifts the line segment I1 in such a manner that the interval d4 between the upper side of the line segment I1 and the upper side 802 of the equalized area reaches (D0−D1)/4. Next, the arithmetic processor 111 shifts the line segment I2 in such a manner that the interval d3 between the lower side of the line segment I1 and the upper side of the line segment I2 reaches (D0−D1)/4. Further, the arithmetic processor 111 shifts the line segment I3 in such a manner that the interval d2 between the lower side of the line segment I2 and the upper side of the line segment I3 reaches (D0−D1)/4. Thus, such an equalizing layout of line segments I1 through I3 as shown in FIG. 9(B) is finished.

After the above equalization, three non-wiring areas d5, d6 and d7 are formed in areas in which the line segments I3 and I4 are disposed (refer to FIG. 9(B)). Accordingly, the width of the non-wiring area d7 may be set to (D0−D2)/3 (where D2 indicates a total line width of the line segments I3 and I4 and refer to FIG. 9(A)). The arithmetic processor 111 re-shifts the line segment I4 in such a manner that the width d7 between the upper side of the line segment I4 and the upper side 802 of the equalized area reaches (D0−D2)/3. Here, the interval between the upper side of the line segment I4 and the upper side 802 of the equalized area is d7=(D0−D2)/3, whereas the interval between the lower side of the line segment I3 and the lower side 801 of the equalized area is d7=(D0−D1)/4. Thus, the layout intervals of the line segments I3 and I4 are not completely equalized. When the error therebetween is within a range insignificant in terms of the manufacture of a semiconductor device (i.e., when there is no fear of migration and a failure in plating), it may be ignored. When, however, there is a fear that it becomes a problem, it is possible to reduce the migration and the failure in plating if, for example, the position of the line segment I4 is adjusted in such a manner that the interval between the upper side 802 of the equalized area and the upper side of the line segment I4 coincides with the interval between the upper side of the line segment I3 and the lower side of the line segment I4.

Even in the areas in which the line segments I5 through I7 (refer to FIG. 8) are disposed, their interval equalization can be carried out in a manner similar to the case of the line segments I1 through I3. Here, the line segments I6 and I7 are connected to each other (refer to FIG. 8(A)). Hence they are identical in net number. In such a case, the Y coordinates of these line segments I6 and I7 can be aligned with each other so as to reach one line segment.

Setting the wire spacing to (D0−Da)/(n+1) within the equalization area as described above enables equalization of the intervals of the corresponding respective line segments (wherein Da: the sum of line widths, and n: the number of line segments). According to such a method, since the equalization can be carried out without consciousness of the line widths of the respective line segments I1 through I7, such processing becomes simple.

Connection Wiring Expanding/Contracting Step

Figure 10:
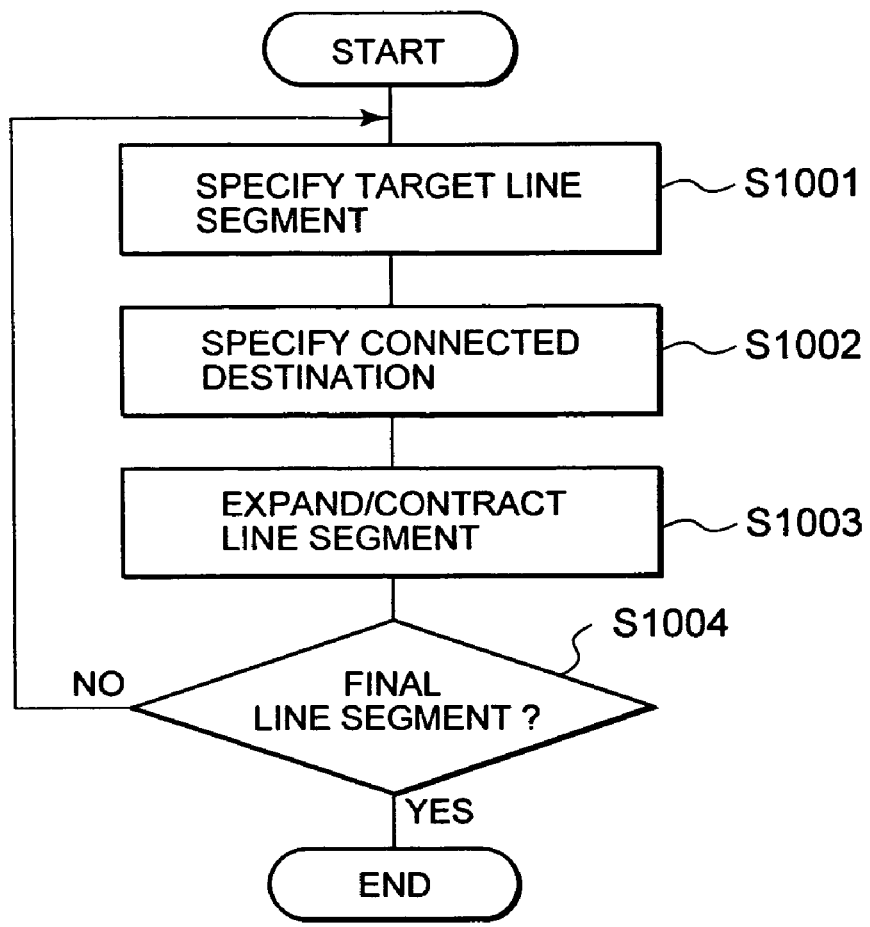
FIG. 10 is a flowchart illustrating a connection wiring expanding/contracting step shown in FIG. 2.
Figure 11:
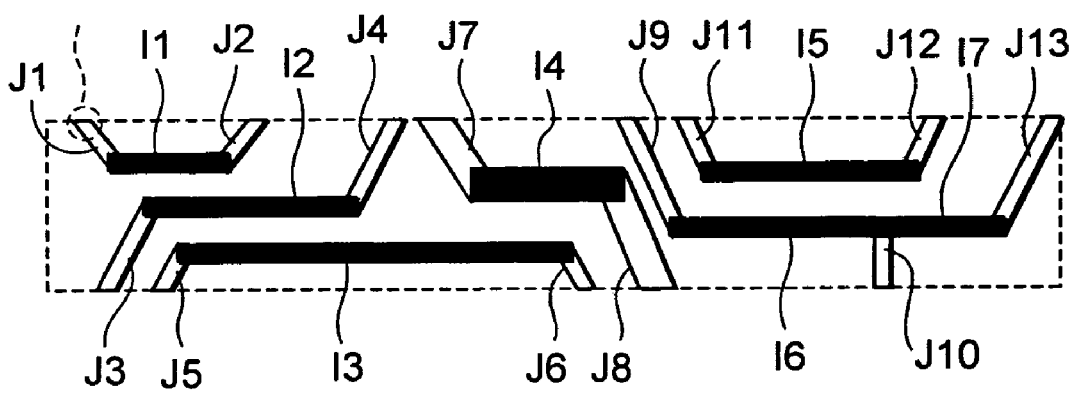
FIG. 11 is a conceptual diagram depicting layout data in the connection wiring expanding/contracting step shown in FIG. 2.

The connection wiring expanding/contracting step S204 will be explained using FIGS. 10 and 11. Now, FIG. 10 is a detailed flowchart showing the present step S204, and FIG. 11 is a conceptual diagram showing layout data in the present step S204, respectively.

In the connection wiring expanding/contracting step S204 as will be described below, the line segments J1 through J13 (refer to FIG. 8(A)) other than the equalized line segments are extracted from the wirings extracted in the wiring extracting step S202, followed by being expanded and contracted, whereby the states of connections of the line segments J1 through J13 to the equalized line segments I1 through I7 are restored.

The arithmetic processor 111 first specifies a line segment (line segment J1 here) to be processed from the line segments J1 through J13 (refer to Step S1001).

Next, the arithmetic processor 111 selects the corresponding line segment equivalent to the other to be connected to the line segment J1 from the equalized line segments I1 through I7 (refer to Step S1002).

Subsequently, the arithmetic processor 111 expands and contracts the line segment J1 in the Y-axis direction while its cut portion (portion that contacts the outer edge of the equalized area) is being fixed, and thereby restores its connection relationship (refer to Step S1003).

Then, the arithmetic processor 111 checks whether non-restored line segments remain. When the answer is found to be Yes, the arithmetic processor 111 returns to Step S1001 (refer to Step S1004).

Repeating such processing until the non-restored line segments are brought to naught makes it possible to complete the connection wiring expanding/contracting step S204 (refer to FIG. 11).

Thereafter, when the processed equalized area corresponds to the equalized area long in the Y-axis direction, processing opposite to the above Step S504 is executed to restore it to the original state.

As described above, the wiring extracting step S202, the wire space equalizing step S203 and the connection wiring expanding/contracting step S204 are executed on all the equalized areas 431 through 436 and 441 through 446 (refer to FIG. 4). And when processing for the final equalized area is ended, the arithmetic processor 111 stores layout data subjected to the equalization processing in the layout data storage area 122 and terminates the wiring space automatic equalizing processing according to the present embodiment.

The layout data stored in the layout data storage area 122 are read by other automatic designing apparatus and used in the following automatic design process.

As mentioned above, the automatic design technique according to the present embodiment is capable of automatically equalizing the wirings among the pads PW1 through PN9 and the tower posts T(1, 1) through T(5, 5) only by the simple processing. It is thus possible to prevent migration and a failure in plating while reducing manual working processes. Automatization makes it possible to prevent human errors such as the occurrence of leakage in the equalizing processing, mistakes in the set values of the wire spacings. In the redistribution wirings among the pads and the tower posts in the chip size package like the W-CSP in particular, the wirings are apt to concentrate on the areas (refer to the equalized areas 431, 436, 441 and 446 in FIG. 4) among the rows of the pads and the outermost tower posts. Thus, it is effective to apply the automatic design technique according to the present embodiment to such areas.

Further, the automatic design technique according to the present embodiment brings the line segments identical in net number to one line segment (refer to Step S203) to thereby make it possible to reduce bending of the wirings (refer to the line segments I6 and I7 in FIG. 8(A) and FIG. 11). Even in this respect, the migration and the failure in plating can be prevented.

Since the automatic design technique according to the present embodiment performs the equalization processing of the line segments with being divided into the equalized areas long in the X-axis direction and the equalized areas long in the Y-axis direction, it can narrow down each wiring to be equalized. It is thus possible to simply carry out the above processing.

In addition, since the automatic design technique according to the present embodiment can treat the equalized areas long in the Y-axis direction as the equalized areas long in the X-axis direction, it can unify the processes on these equalized areas. Accordingly, a processing program becomes simple.

In conjunction with the above, the automatic design technique according to the present embodiment needs not to recognize the line widths of the line segments to be equalized in the wire space equalizing step S203. Therefore, the processing becomes simple.

Second Preferred Embodiment

An automatic designing method according to a second embodiment and wiring space automatic equalizing processing according to an automatic designing apparatus will next be explained.

The present embodiment shows an example in which the automatic design technique of the present invention is applied to wiring space equalization of a semiconductor integrated circuit that has adopted a standard cell system.

Figure 12:
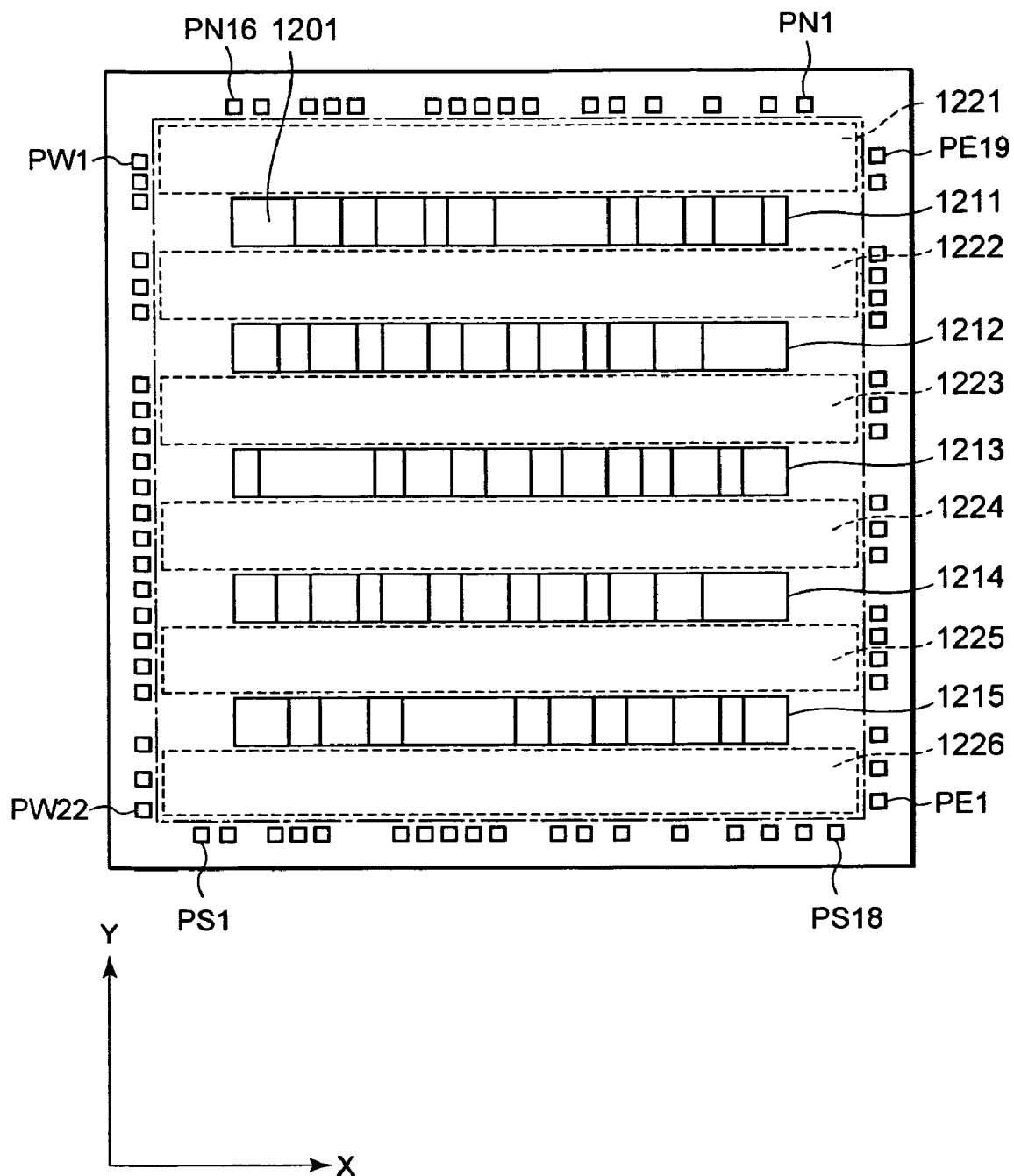
FIG. 12 is a conceptual diagram showing layout data according to a second embodiment.

FIG. 12 is a plan view schematically showing layout data of the semiconductor integrated circuit having adopted the standard cell system.

As shown in FIG. 12, a large number of pads PW1 through PW22, PS1 through PS18, PE1 through PE19, and PN1 through PN16 are disposed in the neighborhood of the outer periphery of a semiconductor chip 1200. And a large number of standard cells 1201 are disposed in the central portion of the semiconductor chip 1200. These standard cells 1201 constitute a plurality of standard cell rows. In the example shown in FIG. 12, five standard cell rows 1211 through 1215 are configured.

The pads PW1 through PN16 and standard cells 1201 are connected to one another by unillustrated wirings. The semiconductor integrated circuit according to the present embodiment is provided with a plurality of wiring layers. Wirings provided in the respective wiring layers are interconnected with one another through contact cells.

In the present embodiment, equalized areas are set to regions or areas 1222, 1223, 1224 and 1225 interposed among the adjacent standard cell rows, an area 1221 between the standard cell row 1211 corresponding to the leading row and a pad row of the pads PN1 through PN16, which is adjacent thereto, and an area 1226 between the standard cell row 1215 corresponding to the final row and a pad row of the pads PS1 through PS18, which is adjacent thereto. That is, in the present embodiment, only the equalized areas 1221 through 1226 in an X-coordinate direction are set and equalized areas in a Y-coordinate direction are not set. The respective equalized areas 1221 through 1226 are respectively provided with a plurality of wiring layers. In the present embodiment, the wiring space automatic equalizing processing is effected on all the wiring layers.

Since the configuration of the automatic designing apparatus employed in the present embodiment is similar to that of the automatic designing apparatus according to the first embodiment, its explanation is omitted.

Figure 13:
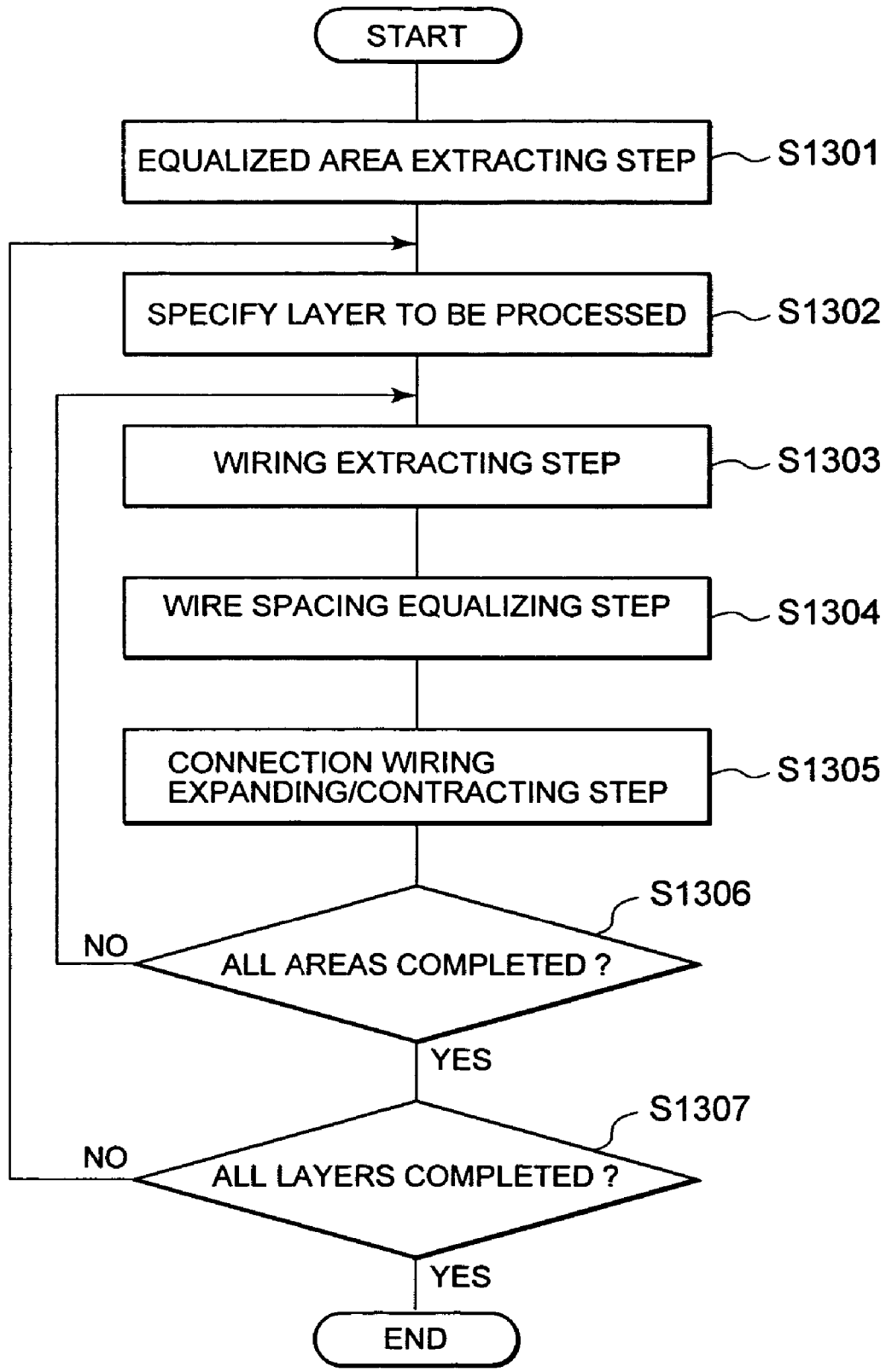
FIG. 13 is a schematic flowchart illustrating an overall constitution of am automatic designing method according to the second embodiment.

FIG. 13 is a schematic flowchart showing an overall constitution of automatic design according to the present embodiment.

In the automatic design processing according to the present embodiment as shown in FIG. 13, an arithmetic processor 111 first executes an equalized area extracting step (refer to Step S1301). The contents of the equalized area extracting step S1301 are similar to that employed in the first embodiment (refer to Step S201 in FIG. 2). However, in the present embodiment as described above, only the equalized areas 1221 through 1226 long in the X-coordinate direction are set and the equalized areas long in the Y-coordinate direction are not set.

Next, the arithmetic processor 111 specifies a layer for carrying out equalization processing from the wiring layers (refer to Step S1302). In the present embodiment, the wiring space automatic equalizing processing on the respective equalized areas 1221 through 1226 is performed every wiring layers.

Subsequently, the arithmetic processor 111 executes a wiring extracting step (refer to Step S1303). In the wiring extracting step S1303 employed in the present embodiment, the arithmetic processor 111 first specifies an equalization area in a manner similar to the wiring extracting step (refer to FIG. 5) according to the first embodiment (refer to S501). Next, the arithmetic processor 111 extracts wirings in the corresponding equalized area (refer to S502). Since, however, the equalized areas long in the Y-coordinate direction are not set in the present embodiment, the processing (refer to S503 and S504) for converting wiring data is not carried out where the equalized areas are long in the Y-axis direction.

Further, the arithmetic processor 111 performs a wire space equalizing step (refer to Step S1304) and a connection wiring expanding/contracting step (refer to Step S1305). These steps S1304 and S1305 are similar to the wire space equalizing step (refer to Step S203) and connection wiring expanding/contracting step (refer to Step S204). In the present embodiment, however, the contact cells are also shifted with the movement and expansion/contraction of the wiring line segments.

Thereafter, the arithmetic processor 11 determines whether the equalization of wire spacings for all the equalized areas 1221 through 1226 in the corresponding wiring layer is completed (Step S1306). When the non-processed equalized areas still remain, the arithmetic processor 111 executes the processing of Steps S1303 to S1305 on the following equalized area.

On the other hand, when it is determined in Step S1306 that the equalization of the wire spacings for all the equalized areas 1221 through 1226 is finished, the arithmetic processor 111 subsequently determines whether the wiring space equalization with respect to all wiring layers is completed (refer to S1307). When wiring layers on which the wiring space equalization is not effected, remain, the arithmetic processor 111 performs switching to a wiring layer intended for equalization (refer to Step S1302), and executes the processing of Steps S1303 through S1305.

When it is determined in Step S1307 that the wiring space equalization with respect to all the wiring layers has been completed, the arithmetic processor 111 terminates its processing.

According to the present embodiment as described above, the automatic design technique according to the present invention can be applied to the wiring processing of the semiconductor integrated circuit having adopted the standard cell system. According to the present embodiment, it is therefore possible to prevent migration and a failure in plating while reducing manual working processes and prevent human errors at the equalization processing for the reasons similar to the first embodiment. According to the automatic design technique according to the present embodiment as well, bending of each wiring can be reduced for the reasons similar to the first embodiment. Since it is not necessary to take into consideration the line width of each line segment to be equalized, the processing is simple.

In the present embodiment, the line segments identical in net number are brought to one line segment (refer to Step S203 in FIG. 2) to thereby make it possible to reduce not only bending of the wirings in the same wiring layer but also wiring connections between the different wiring layers. Thus, since the number of contact cells can be reduced, wiring resistance can be reduced.

Third Preferred Embodiment

An automatic designing method according to a third embodiment and wiring space automatic equalizing processing according to an automatic designing apparatus will next be explained.

An overall constitution for automatic design according to the present embodiment is similar to that employed in the second embodiment (FIG. 13). However, the present embodiment is different in wire space equalizing step (Step S1304 in FIG. 13) from the second embodiment.

FIG. 14 is a detailed flowchart showing a wire space equalizing step according to the present embodiment, and FIG. 15 is a conceptual diagram showing layout data in the wire spacing equalizing step, respectively.

Figure 15A:
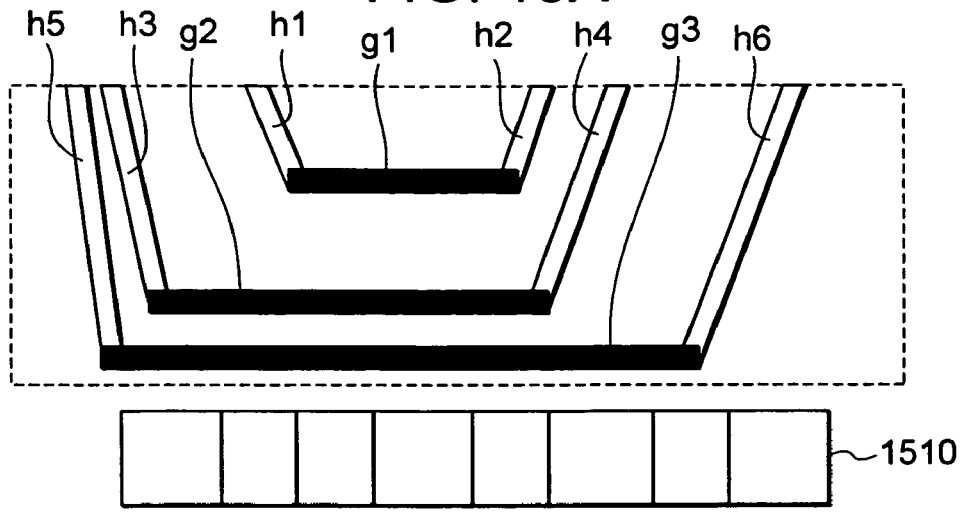
FIG. 15 is a conceptual diagram illustrating layout data in the wire space equalizing step according to the third embodiment.

An arithmetic processor 111 first extracts line segments (i.e., line segments extending in the longitudinal direction of an equalized area) g1 through g3 to be equalized from the wirings extracted in the wiring extracting step (refer to Step S1303 in FIG. 13) (refer to Step S1401 and FIG. 15(A)).

Next, the arithmetic processor 111 allows a wiring state memory 112 (refer to FIG. 1) to store the line segments g1 through g3 intended for equalization, other line segments h1 through h6 respectively connected to these line segments, and net numbers for these line segments g1 through g3 and h1 through h6 (refer to Step0 S1402).

Figure 15B:
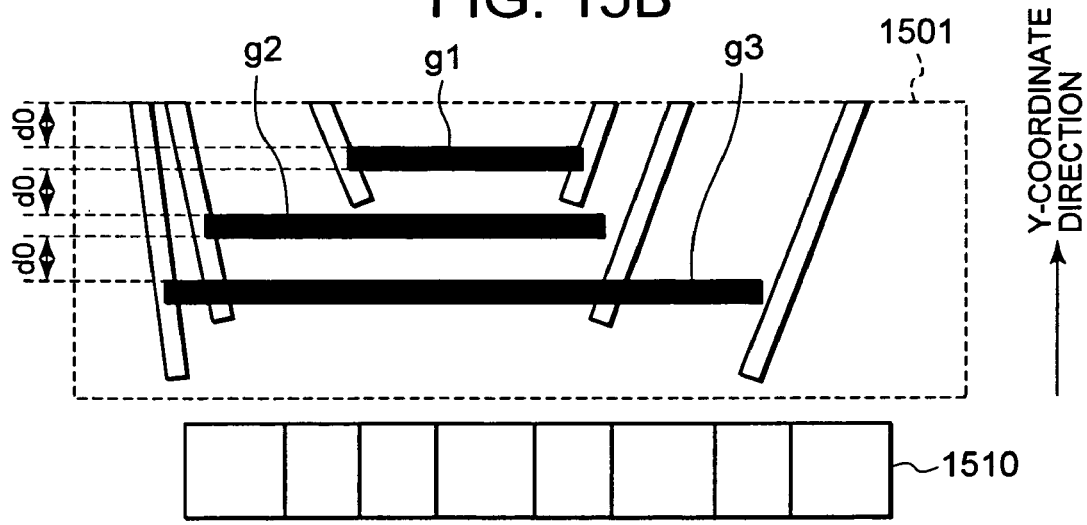
Figure 15C:
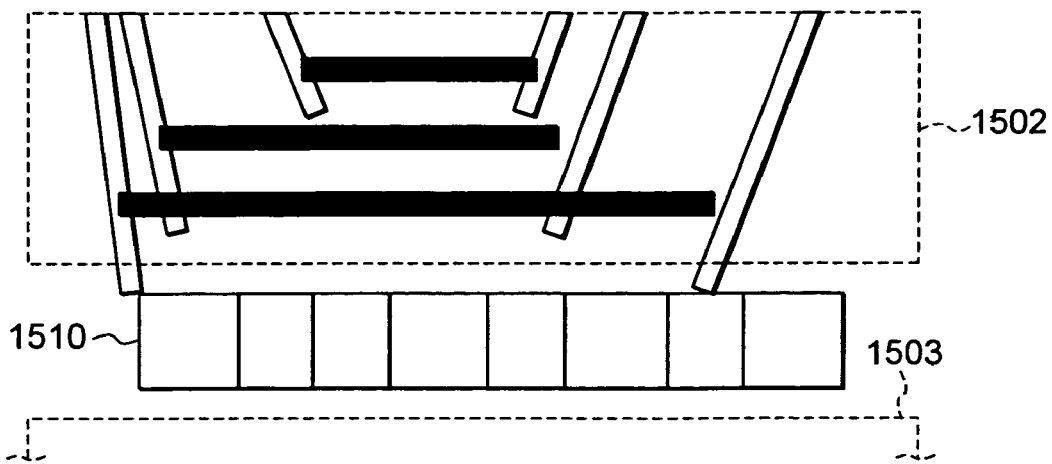

Subsequently, the arithmetic processor 111 performs the processing of aligning intervals defined among the line segments g1 through g3 to be equalized with the minimum line segment spacing d0 defined in advance (refer to Step S1403). Upon this processing, the arithmetic processor 111 first shifts the line segment g1 closest to a Y coordinate of an upper side 1501 of the equalized area to a position spaced away from the upper side 1501 by the minimum line segment spacing d0 as shown in FIG. 15(B). Subsequently, the arithmetic processor 111 shifts the second line segment g2 to a position spaced away from a lower side of the segment g1 by the minimum line segment spacing d0. Further, the arithmetic processor 111 shifts the third line segment g3 to a position spaced away from a lower side of the line segment g2 by the minimum line segment spacing d0.

In succession to the above, the arithmetic processor 111 shifts a Y coordinate of a lower side 1502 of the equalized area to a position spaced away from a lower side of the line segment g3 by the minimum line segment spacing d0 and shifts the position of a standard cell row 1510 of the following stage in accordance with the amount of coordinate shift of the lower side 1502. Further, the arithmetic processor 111 shifts even an upper side coordinate 1503 of the next equalized area in accordance with the amount of shift of the standard cell row 1510 (refer to Step S1404 and FIG. 15(C)).

The above processing is effected on all the equalized areas.

In the present embodiment, the minimum line segment spacing d0 is now set to such a minimum line. segment spacing that migration and a failure in plating can be prevented.

In the present embodiment as described above, the spacing the line segments g1 through g3 to be equalized are all set to the minimum line segment d0, and the positions of the standard cell rows are also shifted in conjunction with the minimum line segment spacing d0. Thus, since wiring regions can be compressed, placement areas can be reduced.

In a manner similar to the second embodiment in addition to the above, the migration and the failure in plating can be prevented while reducing manual working processes, and human errors at the equalization processing can be prevented. It is also possible to reduce bending of each wiring and the number of contact cells. Further, since it is not necessary to recognize a line width of each line segment to be equalized, the above processing is simple.

While the preferred forms of the present invention have been described, it is to be understood that modifications will be apparent to those skilled in the art without departing from the spirit of the invention. The scope of the invention is to be determined solely by the following claims.

What is claimed is:

1. An automatic designing method for a semiconductor device, which automatically performs processing for equalizing spacing wirings formed in a semiconductor integrated circuit, said method comprising:

an area extracting step for extracting an equalized area from layout data of the semiconductor integrated circuit;

a wiring extracting step for extracting the wirings from the equalized area extracted in the area extracting step;

an equalizing step for extracting line segments extending in a longitudinal direction of the equalized area from the wirings extracted in the wiring extracting step and shifting the extracted line segments to thereby equalize spacing between these line segments; and an expanding/contracting step for extracting other line segments from the wirings extracted in the wiring extracting step and expanding/contracting the extracted line segments to thereby restore states of connections of other line segments to the longitudinally-extending line segments.

2. The automatic designing method according to claim 1, wherein the equalized area extracted in the area extracting step includes at least any of areas interposed among adjacent rows of external connecting electrodes, an area interposed between a leading row of the external connecting electrodes and a pad row adjacent to the leading row, an area interposed between a final row of the external connecting electrodes and a pad row adjacent to the final row, areas interposed among adjacent columns of the external connecting electrodes, an area interposed between a leading column of the external connecting electrodes and a pad column adjacent to the leading column, and an area interposed between a final column of the external connecting electrodes and a pad column adjacent to the final column.

3. The automatic designing method according to claim 2, wherein the wiring extracting step includes processing for turning the line segments extracted from the equalized area whose longitudinal direction is a column direction, by 90° and mirror-reversing the same on a coordinate axis as viewed in a row direction.

4. The automatic designing method according to claim 1, wherein the equalized area extracted in the area extracting step includes at least any of areas interposed among adjacent standard cell rows, an area interposed between the standard cell row corresponding to a first row and a pad row adjacent thereto, and an area interposed between a final standard cell row and a pad row adjacent thereto.

5. The automatic designing method according to claim 1, wherein the equalizing step is a step for laying out the line segments extending in the longitudinal direction at uniform intervals within the equalized area.

6. The automatic designing method according to claim 4, wherein the equalizing step is a step for laying out the line segments extending in the longitudinal direction at predetermined intervals within the equalized area and laying out the following-stage standard cell row so as to be spaced away from the finally disposed line segment by the predetermined interval.

7. An automatic designing apparatus for a semiconductor device, which automatically performs processing for equalizing spacing wirings formed in a semiconductor integrated circuit, said automatic designing apparatus comprising:

area extracting means for extracting an equalized area from layout data of the semiconductor integrated circuit;

wiring extracting means for extracting the wirings from the equalized area extracted by the area extracting means;

equalizing means for extracting line segments extending in a longitudinal direction of the equalized area from the wirings extracted by the wiring extracting means and shifting the extracted line segments to thereby equalize spacing between these line segments; and expanding/contracting means for extracting other line segments from the wirings extracted by the wiring extracting means and expanding/contracting the extracted line segments to thereby restore states of connections of other line segments to the longitudinally-extending line segments.

8. The automatic designing apparatus according to claim 7, wherein the equalized area extracted by the area extracting means includes at least any of areas interposed among adjacent rows of external connecting electrodes, an area interposed between a leading row of the external connecting electrodes and a pad row adjacent to the leading row, an area interposed between a final row of the external connecting electrodes and a pad row adjacent to the final row, areas interposed among adjacent columns of the external connecting electrodes, an area interposed between a leading column of the external connecting electrodes and a pad column adjacent to the leading column, and an area interposed between a final column of the external connecting electrodes and a pad column adjacent to the final column.

9. The automatic designing apparatus according to claim 8, wherein the wiring extracting means performs processing for turning the line segments extracted from the equalized area whose longitudinal direction is a column direction, by 90° and mirror-reversing the same on a coordinate axis as viewed in a row direction.

10. The automatic designing apparatus according to claim 7, wherein the equalized area extracted by the area extracting means includes at least any of areas interposed among adjacent standard cell rows, an area interposed between the standard cell row corresponding to a first row and a pad row adjacent thereto, and an area interposed between a final standard cell row and a pad row adjacent thereto.

11. The automatic designing apparatus according to any of claims 7 to 10, wherein the equalizing means is means for laying out the line segments extending in the longitudinal direction at uniform intervals within the equalized area.

12. The automatic designing apparatus according to claim 10, wherein the equalizing means is means for laying out the line segments extending in the longitudinal direction at predetermined intervals within the equalized area and laying out the following-stage standard cell row so as to be spaced away from the finally disposed line segment by the predetermined interval.

* * * * *